United States Patent [19]

Rosati

[11] 4,453,141
[45] Jun. 5, 1984

[54] SUPPRESSION OF VIBRATION EFFECTS ON PIEZOELECTRIC CRYSTAL RESONATORS

[75] Inventor: Vincent J. Rosati, Oakhurst, N.J.

[73] Assignee: The United States of America as represented by the Secretary of the Army, Washington, D.C.

[21] Appl. No.: 343,644

[22] Filed: Jan. 28, 1982

[51] Int. Cl.³ .......................... H03B 5/32; H03B 5/04
[52] U.S. Cl. ................................ 331/158; 331/116 R; 331/175; 310/316; 310/317
[58] Field of Search ................. 331/116 R, 158, 175; 310/316, 317

[56] References Cited

U.S. PATENT DOCUMENTS

| | | | |
|---|---|---|---|
| 3,662,269 | 5/1972 | Osborne et al. | 331/175 |
| 3,931,533 | 1/1976 | Raso et al. | 310/316 |
| 4,197,478 | 4/1980 | Silvus | 310/316 |
| 4,318,063 | 3/1982 | Przyjemski | 331/158 |

OTHER PUBLICATIONS

*ERADCOM Technical Report*, DELET-TR-80-10, "The Effect of Vibration on Quartz Crystal Resonators", R. L. Filler.
Frequency and Time Systems, Inc. Application Note #61, 1978, "Acceleration Sensitivity . . . Crystal Oscillators", D. A. Emmons.
*Proc. 34th Ann. Freq. Control Symp.*, 1980, "Fundamental Mode SC-CUT Resonators", R. L. Filler & J. R. Vig.
Proc. NAECON, 1977, "Limitations . . . Imposed by Crystal-Oscillator g-Sensitivity", J. M. Przyjemski & P. L. Konop.
Proc. NAECON, 1978, "A Compensation Technique for . . . Changes in Crystal Oscillators", J. M. Przyjemski.

*Primary Examiner*—John S. Heyman
*Attorney, Agent, or Firm*—Robert P. Gibson; Jeremiah G. Murray; Edward Goldberg

[57] ABSTRACT

An active method and apparatus for suppressing or cancelling the effects of vibration on quartz crystal controlled oscillators by generating an electrical signal which is a replica of the vibration acting on the crystal resonator, which signal is thereafter properly phased and applied directly to the crystal electrodes which thereby operates to substantially eliminate unwanted vibration-induced sidebands in the signal output of the oscillator.

14 Claims, 4 Drawing Figures

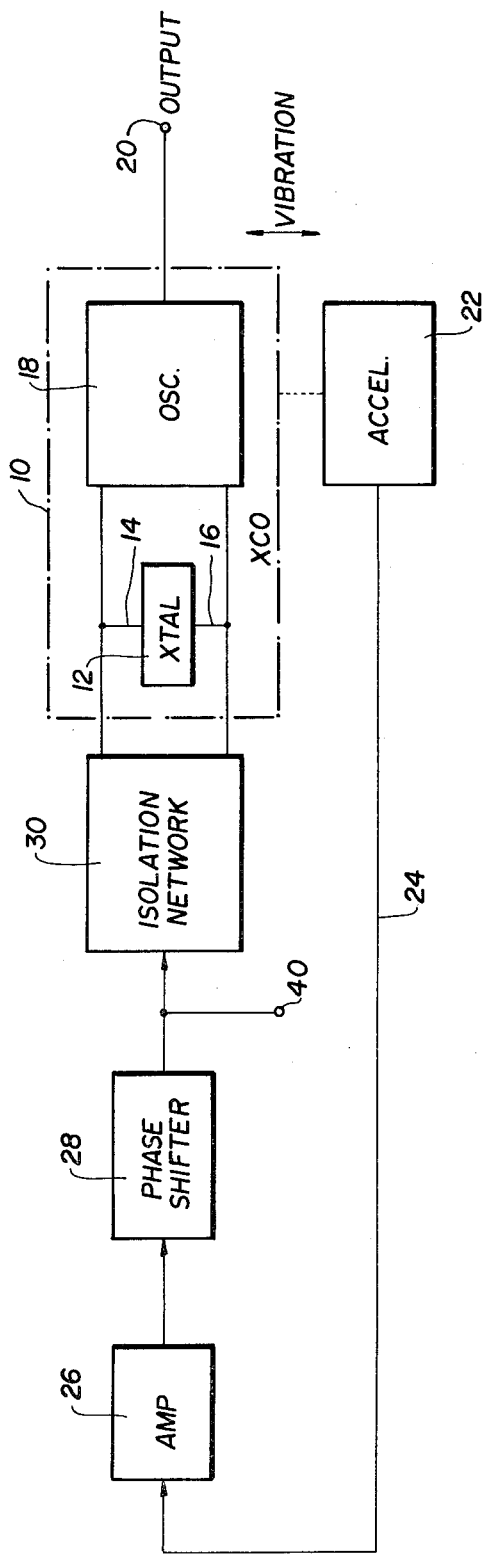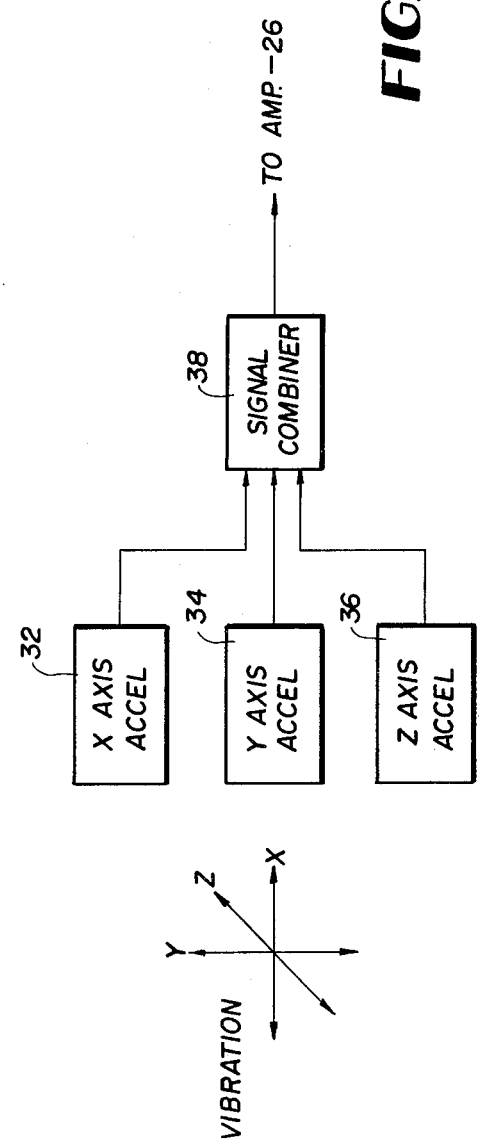

SUPPRESSION OF VIBRATION EFFECTS ON PIEZOELECTRIC CRYSTAL RESONATORS

The invention described herein may be manufactured, used, and licensed by or for the Government for governmental purposes without the payment to me of any royalties thereon.

BACKGROUND OF THE INVENTION

This invention relates generally to crystal controlled oscillators and more particularly to the suppression of adverse effects on the output of the oscillator due to vibration of the crystal resonator.

When a piezoelectric material such as a quartz crystal resonator is subjected to a stress, a shift of its natural resonant frequency occurs. If, for example, the stress applied is periodic, such as when a crystal resonator is vibrated, the resonant frequency shifts in a similarly periodic manner. This frequency shift gives rise to undesired frequency modulated sidebands.

In electronic systems utilized for modern communications, navigation, and radar, a relatively high spectral purity is required and frequency modulated sidebands produced as a result of vibration cause severe adverse effects to occur. For example, under certain vibration and frequency multiplication conditions, the desired carrier frequency can disappear entirely leaving only the undesired sidebands. Also, the signal to noise ratio can reach a level where catastrophic effects result, particularly in coherent radar sets resulting in a reduction of the probability of detection of echoes in such systems.

By substantially suppressing, or entirely eliminating the vibration-induced sidebands, none of the above mentioned adverse effects occur. Both passive and active approaches have been taken heretofore to reduce effects of vibration on crystal resonators. The proper circuit design with compensating networks coupled to the resonator comprises one passive means while another approach consists in utilizing two resonators in series. An active method has been proposed by J. M. Przyjemski in a publication entitled, "A Compensation Technique For Acceleration-Induced Frequency Changes in Crystal Oscillators", which appeared in the Proceedings of NAECON 78, May, 1978. What is suggested in this publication is sensing the components of acceleration normal to the plane of zero g-sensitivity by an accelerometer which produces a correction voltage which is applied to the frequency control input of the crystal oscillator. Such compensation is accomplished by adjusting the resonant frequency of the oscillator but not the crystal resonator. Another approach uses a varactor diode to alter the frequency of the crystal resonator by changing the load capacitance. This is suggested in a publication entitled, "Acceleration Sensitivity Compensation In High Performance Crystal Oscillators" by Donald A. Emmons, which comprises Application Note Number 61 of the PTTI Meeting, November, 1978. In such an application, however, the nonlinearity of the varactors used for the implementation of the method suggested limits the ultimate amount of reduction possible.

It is an object of the present invention therefore to provide an improvement in the suppression of vibration induced effects on crystal controlled oscillators.

It is another object of the present invention to provide for suppression of vibration-induced sidebands in the output of crystal controlled oscillators.

And yet a further object of the present invention is to provide a direct compensation to a crystal resonator for eliminating vibration induced sidebands in the output of a crystal controlled oscillator.

SUMMARY

These and other objects are achieved in accordance with a method and apparatus for actively reducing the effects of vibration on stress compensated (SC) cut quartz crystal resonators controlling the frequency of an oscillator by sensing the vibration present on the oscillator and generating an electrical signal which is a replica of the vibration, which signal is thereafter properly phased and amplified and applied directly to the electrodes of the crystal resonator.

DESCRIPTION OF THE DRAWINGS

While the present invention is described in particularity for providing a basis of the claims annexed to and forming a part of this specification, a better understanding of the invention can be had by reference to the following description taken in conjunction with the accompanying drawings in which:

FIG. 1 is an electrical block diagram illustrative of the basic embodiment of the subject invention;

FIG. 2 is an electrical block diagram of a modification for the embodiment shown in FIG. 1;

DESCRIPTION OF THE PREFERRED EMBODIMENT

Figure 3:
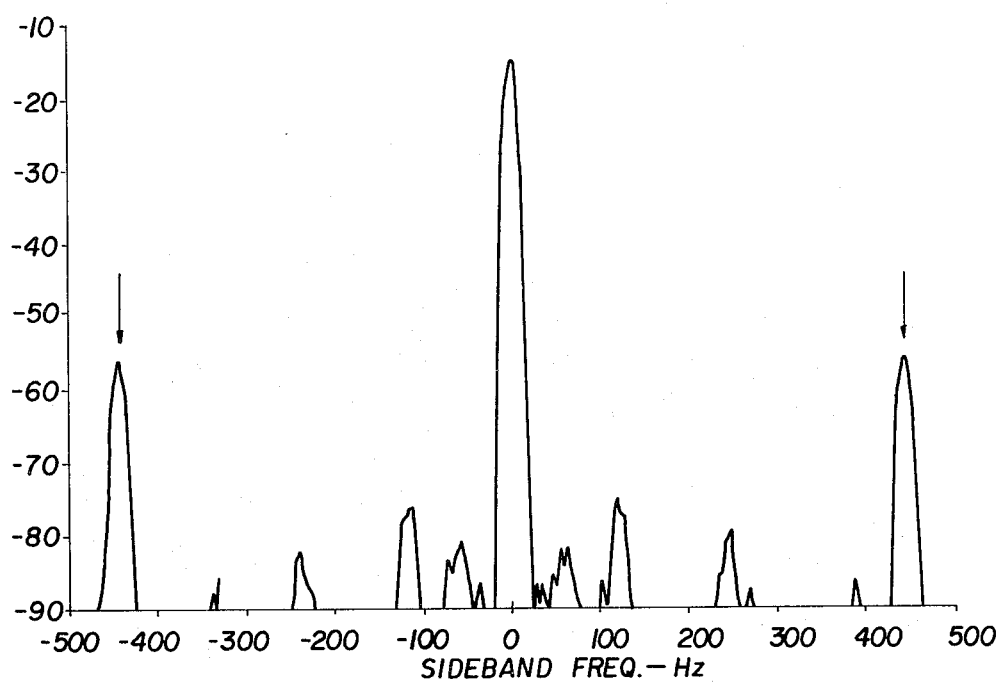
FIG. 3 is a graphical illustration of the frequency spectrum of the output of a crystal controlled oscillator having vibration induced sidebands and where no suppression is present.

Referring now to the drawings and more particularly to FIG. 1, reference numeral 10 designates a crystal controlled oscillator (XCO) including a stress compensated (SC) piezoelectric crystal resonator, typically composed of quartz, which has the property of linearly changing its resonant frequency when a voltage is applied across its electrodes 14 and 16. The crystal resonator 12 is connected to and is the frequency determining element of electrical oscillator circuit 18 of a well known type which is adapted to provide a highly stable output signal, for example, at terminal 20. The crystal controlled oscillator 10 is shown subject to a single axis mechanical vibration as indicated by the double tipped arrow.

The present invention includes a mechanical to electrical transducer element in the form of an accelerometer 22 which is shown mechanically connected to the crystal controlled oscillator 10 for sensing the frequency and magnitude of the vibration present. The transducer operates to generate an electrical output signal on circuit lead 24 which is an electrical analog signal of the vibration. The electrical analog signal is applied to a wideband amplifier 26 and electrical phase shifter 28 where it is thereafter applied directly to the resonator electrodes 14 and 16 by means of an electrical isolation network 30.

Figure 4:
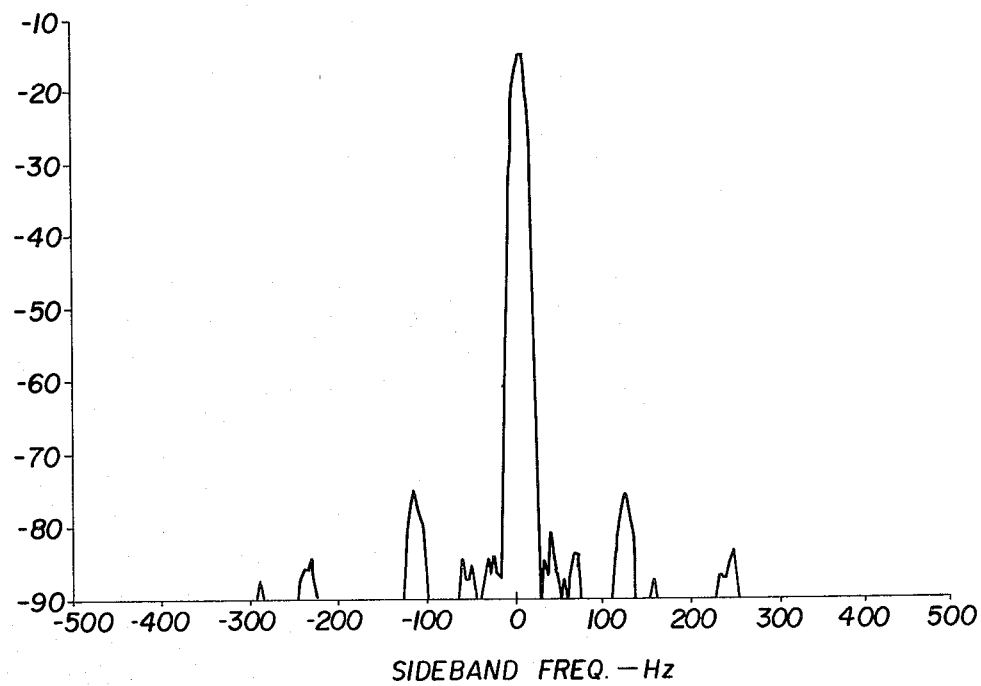
FIG. 4 is a graphical illustration of the frequency spectrum of a crystal controlled oscillator having vibration induced sidebands suppressed in accordance with the subject invention.

By selectively adjusting the gain of the amplifier 26 and the phase shift of the output of the phase shifter 28, the resulting effect is a suppression or cancellation of the undesired vibration-induced sidebands in the oscillator output signal which as noted above, occurs when a crystal resonator is vibrated, causing the resonant frequency to shift in a periodic manner and giving rise to frequency modulated sidebands. Accordingly, the phase shifter 28 acts to apply a signal of the appropriate frequency and opposite phase across the crystal electrodes 14 and 16 with the necessary amplitude to oppose the normally induced-sideband frequencies. This direct application of a counteracting control voltage to the crystal electrodes 14 and 16 results not only in an extremely simple solution to an existing problem, but also adapts itself to a variety of different oscillator circuits while improving linearity and response.

Where the circuit configuration of FIG. 1 is subject to random variations both in frequency and direction, three orthogonal accelerometers 32, 34 and 36 as shown in FIG. 2 can be adapted to respectively sense acceleration along the X-Y-Z axes shown. By coupling the outputs of the three accelerometers 32, 34 and 36 to an appropriate signal combiner 38, a composite signal is provided which when coupled to the amplifier 26, shown in FIG. 1, is adapted to provide the necessary compensating signal directly to the crystal electrodes 14 and 16 of the crystal resonator 12. When desirable, a DC voltage supplied, for example, by way of terminal 40 can be added to the AC compensating voltage or used alone for the purpose of tuning the voltage controlled oscillator 10 via the SC cut crystal 12 without the need for varactor diodes which are conventionally used in prior art apparatus to alter the frequency of the resonator by changing the load capacitance.

Where for example an SC cut crystal is operated at a frequency of 5 MHz and subjected to a 14 g acceleration at a periodic frequency of 450 Hz, experimental tests have indicated that vibration-induced sidebands 450 Hz above and below the center frequency (0) as shown in FIG. 3 are substantially eliminated by being reduced by at least 35 dB providing a spectrum output as shown in FIG. 4.

Thus what has been shown and described is a relatively simple technique for the tuning of crystal oscillators and/or the suppression of unwanted vibration induced sidebands in a linear fashion by connecting a control voltage directly to the crystal electrodes.

Having thus shown and described what is at present considered to be the preferred embodiment of the invention, the foregoing detailed description has been made by way of illustration and not limitation and accordingly all modifications, alterations, and changes coming within the spirit and scope of the invention as defined in the appended claims are meant to be included.

What is claimed is:

1. A method of suppressing the effects of vibration acting on a piezoelectric crystal resonator which comprises the frequency determining element of a crystal controlled oscillator whereby vibration-induced sideband frequencies are produced in a vibrational environment, comprising the steps of:
    sensing the frequency and amplitude and phase of vibration of the crystal resonator and generating an electrical analog signal of the vibration having a corresponding frequency, amplitude and phase;
    amplifying and phase shifting said analog signal to provide a signal having a selectively adjustable amplitude and opposite phase; and
    applying the signal of selective amplitude and opposite phase directly to the electrodes of the crystal resonator to suppress the sideband frequencies.

2. The method as defined by claim 1 wherein said step of sensing the vibration comprises sensing vibration along at least one linear axis.

3. The method as defined by claim 1 wherein said step of sensing the vibration comprises sensing the vibration along three mutually orthogonal axes.

4. The method as defined by claim 3 wherein said step of generating an analog signal comprises generating a composite electrical analog signal of vibrations along said mutually orthogonal axes.

5. The method as defined by claim 1 wherein said piezoelectric crystal resonator comprises a stress compensated (SC) cut crystal having the property of changing its resonant frequency in response to a voltage applied to its electrodes.

6. The method as defined by claim 5 and additionally including the step of applying a DC voltage to the electrodes of said crystal resonator for tuning said crystal controlled oscillator.

7. Apparatus for suppressing the effects of vibration on a piezoelectric crystal resonator constituting the frequency determining element of a crystal controlled oscillator, comprising the combination of:
    an oscillator;
    a piezoelectric crystal having a pair of electrodes connected to said oscillator;
    means for sensing the vibration acting on said crystal resonator and generating an electrical analog signal of the vibration having a given amplitude, phase and frequency;
    selectively adjustable means for amplifying and phase shifting said analog signal to provide a corresponding signal having a predetermined amplitude and opposite phase; and
    means for applying said signal of selective amplitude and opposite phase directly across the electrodes of said crystal resonator whereupon said opposite phase signal operates to suppress the generation of vibration-induced sideband frequencies normally generated by said crystal resonator in the presence of said vibration.

8. The apparatus as defined by claim 7 wherein said crystal resonator comprises a stress compensated (SC) cut crystal.

9. The apparatus as defined by claim 8 wherein said means for sensing and generating comprises electrical transducer means operable to sense vibration along at least one linear axis.

10. The apparatus as defined by claim 9 wherein said transducer means comprises an accelerometer.

11. The apparatus as defined by claim 8 wherein said means for sensing the vibration and generating an electrical analog signal comprises electrical transducer means operable to sense vibration along three mutually perpendicular axes, and
    means for combining the respective analog signals of vibration along said three axes into a composite signal.

12. The apparatus as defined by claim 8 and additionally including means for coupling a DC control voltage to the electrodes of said crystal resonator for tuning said crystal controlled oscillator.

13. The apparatus as defined by claim 7 wherein said means for amplifying includes an amplifier having a selectively adjustable gain.

14. The apparatus as defined by claim 7 and additionally including an isolation network coupled between said crystal and said amplifying and phase shifting means.

* * * * *